(12) United States Patent
Li

(10) Patent No.: US 9,215,827 B2
(45) Date of Patent: Dec. 15, 2015

(54) CIRCUIT BOARD MOUNTING ASSEMBLY

(71) Applicant: ShenZhen Treasure City Technology Co., LTD., Shenzhen (CN)

(72) Inventor: Zhan-Yang Li, Shenzhen (CN)

(73) Assignee: ShenZhen Treasure City Technology Co., LTD., ShenZhen (CN)

( * ) Notice: Subject to any disclaimer, the term of this patent is extended or adjusted under 35 U.S.C. 154(b) by 162 days.

(21) Appl. No.: 14/078,728

(22) Filed: Nov. 13, 2013

(65) Prior Publication Data

US 2014/0211433 A1 Jul. 31, 2014

(30) Foreign Application Priority Data

Jan. 29, 2013 (CN) .......................... 2013 1 00328115

(51) Int. Cl.
*G06F 1/16* (2006.01)
*H05K 7/14* (2006.01)

(52) U.S. Cl.
CPC .................................... *H05K 7/1411* (2013.01)

(58) Field of Classification Search
CPC ....... G06F 1/181; G06F 1/187; H05K 7/1424; G11B 33/128
USPC .......................................... 361/679.33, 679.37
See application file for complete search history.

(56) References Cited

U.S. PATENT DOCUMENTS

| | | | | |
|---|---|---|---|---|
| 6,738,255 B2 * | 5/2004 | Chen | ....................... | G06F 1/181 312/223.2 |
| 6,919,510 B1 * | 7/2005 | Chen | ..................... | H05K 5/061 174/17 CT |
| 7,589,960 B2 * | 9/2009 | Li | ........................... | G06F 1/187 211/26 |
| 7,679,934 B2 * | 3/2010 | Fan | ..................... | H05K 7/1424 361/730 |
| 7,782,605 B2 * | 8/2010 | Wu | ...................... | G11B 33/125 312/223.1 |
| 7,855,881 B2 * | 12/2010 | Tsai | ........................ | G06F 1/187 312/223.1 |
| 2007/0144983 A1 * | 6/2007 | Fan | ..................... | H05K 7/1424 211/26 |
| 2008/0128569 A1 * | 6/2008 | Wu | ...................... | G11B 33/128 248/213.2 |
| 2009/0040744 A1 * | 2/2009 | Tsai | ..................... | G11B 33/128 361/825 |
| 2011/0096516 A1 * | 4/2011 | Li | ......................... | H05K 7/142 361/752 |
| 2011/0155871 A1 * | 6/2011 | Li | ........................... | G06F 1/187 248/201 |
| 2012/0026710 A1 * | 2/2012 | Li | ........................... | G06F 1/188 361/803 |

* cited by examiner

*Primary Examiner* — Adrian S Wilson
(74) *Attorney, Agent, or Firm* — Novak Druce Connolly Bove + Quigg LLP

(57) ABSTRACT

A circuit board mounting assembly includes a chassis with a securing hole, a circuit board attached to the chassis, a drive bracket mounted in the chassis, and a latch member configured to latch the circuit board. The drive bracket comprises at least one clamp engaged with the circuit board for preventing the circuit board from moving along a first direction. The latch member comprises a retractable post movable between a latched position and an unlatched position along the first direction. When the retractable post is in the latched position, the retractable post is received through the securing hole for preventing the circuit board from moving along a second direction perpendicular to the first direction, thereby locking the circuit board to the chassis. When the retractable post is in the unlatched position, the retractable post is removed from the securing hole for unlocking the circuit board.

20 Claims, 8 Drawing Sheets

CIRCUIT BOARD MOUNTING ASSEMBLY

BACKGROUND

1. Technical Field

The present disclosure relates to a circuit board mounting assembly.

2. Description of Related Art

Computer systems usually include a circuit board mounted in a computer case. However, installation of the circuit board in the computer case usually involves the use of screws, which is inconvenient.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation. In the figures of the accompanying drawings in which like references indicate similar elements. It should be noted that references to "an" or "one" embodiment in this disclosure are not necessarily to the same embodiment, and such references mean "at least one."

Figure 1:
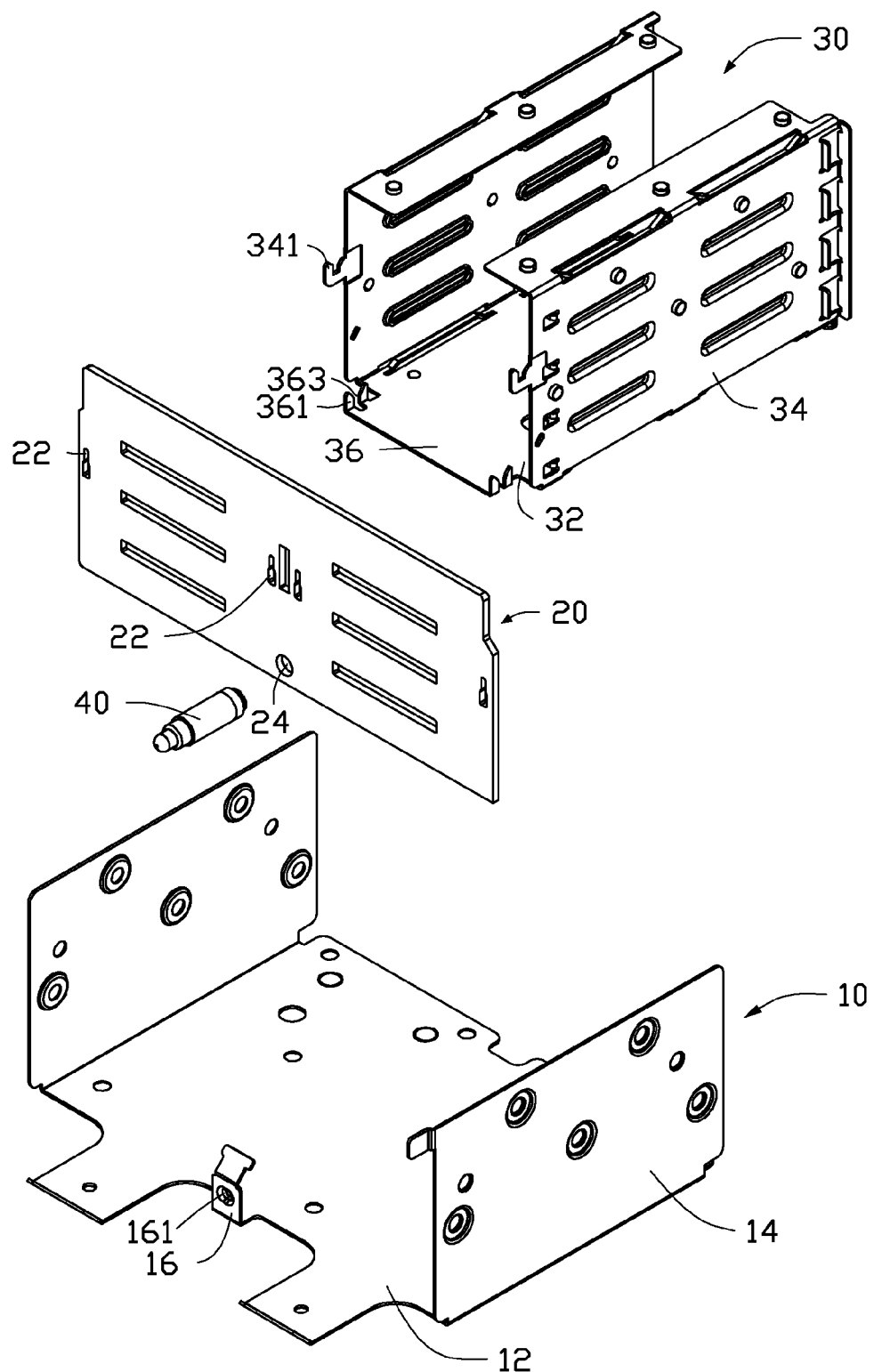
FIG. 1 is an exploded view of an embodiment of a circuit board mounting assembly.

FIG. 1 shows an embodiment of a mounting assembly, which includes a chassis 10, a disk drive bracket 30, and a latching member 40. The mounting assembly is configured to secure a circuit board 20 to the chassis 10.

The chassis 10 includes a base plate 12 and a pair of side plates 14 extending substantially perpendicularly from opposite sides of the base plate 12. A mounting piece 16 extends upwardly from the base plate 12. A securing hole 161 is defined in the mounting piece 16.

Two pairs of mounting slots 22 and a mounting hole 24 are defined in the circuit board 20. The mounting hole 24 is located adjacent to a central lower portion of the circuit board 20.

The disk drive bracket 30 includes a bottom panel 32 and a pair of side panels 34 extending substantially perpendicularly from opposite sides of the bottom panel 32, respectively. A protruding piece 36 protrudes from a front side of the bottom panel 32. Two pairs of tabs 361 extend substantially perpendicularly from opposite edges of the protruding piece 36. A gap 363 is defined between each pair of tabs 361. Each pair of tabs 361 is substantially parallel to the pair of side panels 34. A clamp 341 protrudes from a front edge of each side panel 34. The clamps 341 correspond to one pair of mounting slots 22.

Figure 2:
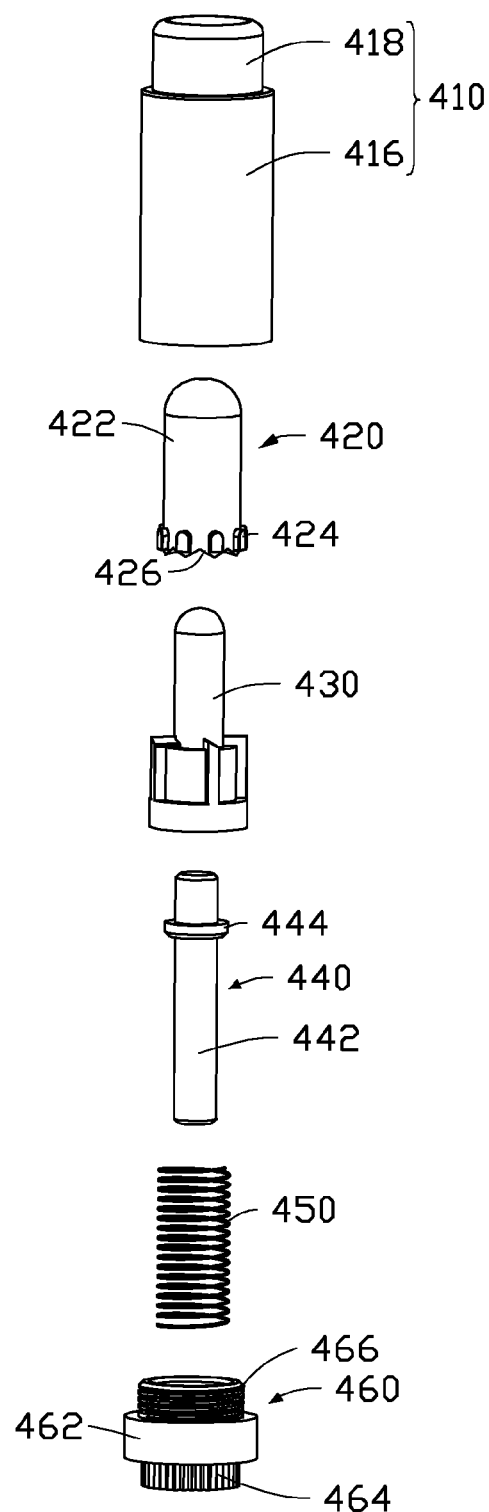
FIG. 2 is an exploded view of a latching member of FIG. 1.
Figure 3:
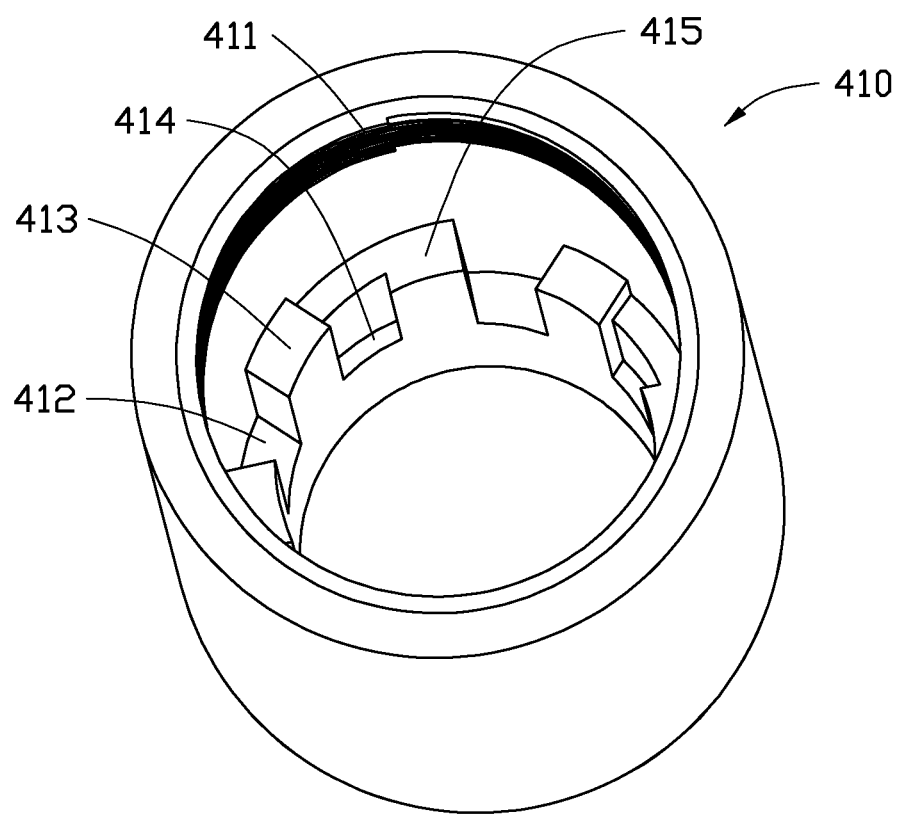
FIG. 3 is a view of a cylindrical casing of FIG. 2.
Figure 4:
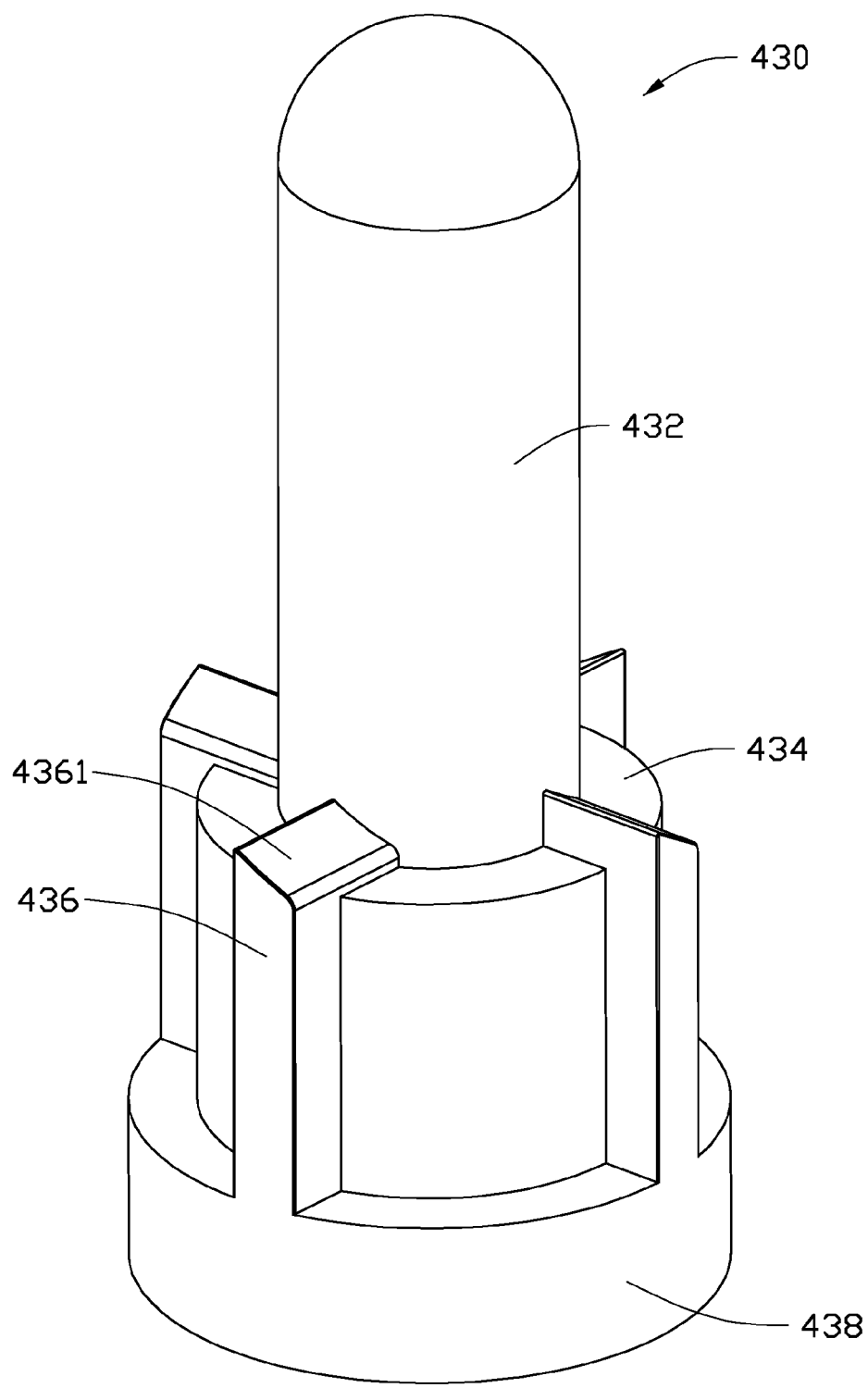
FIG. 4 is an enlarged view of a rotatable member of FIG. 2.
Figure 5:
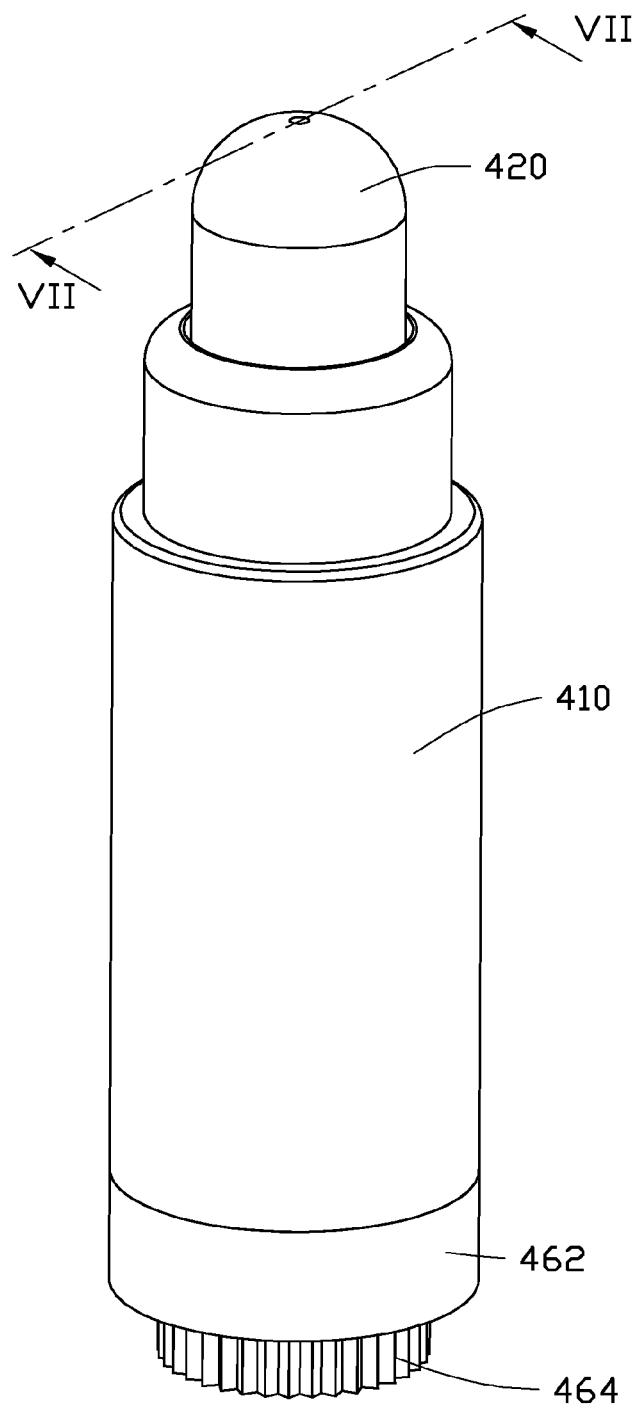
FIG. 5 is an assembled view of the latching member of FIG. 2, showing the latching member in an unlocked state.
Figure 6:
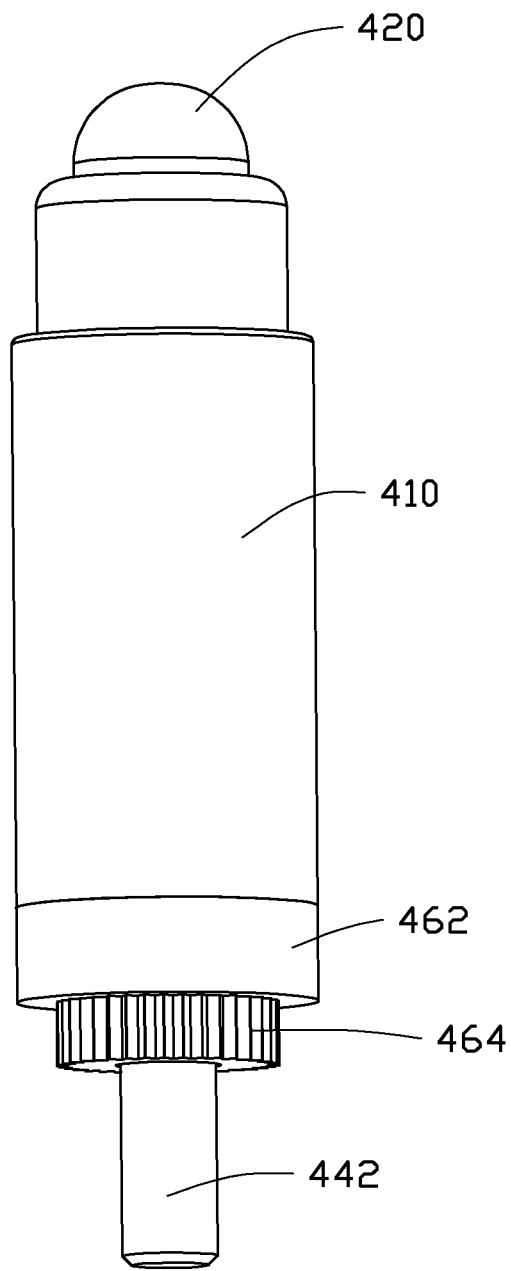
FIG. 6 is an assembled view of the latching member of FIG. 2, showing the latching member in a locked state.
Figure 7:
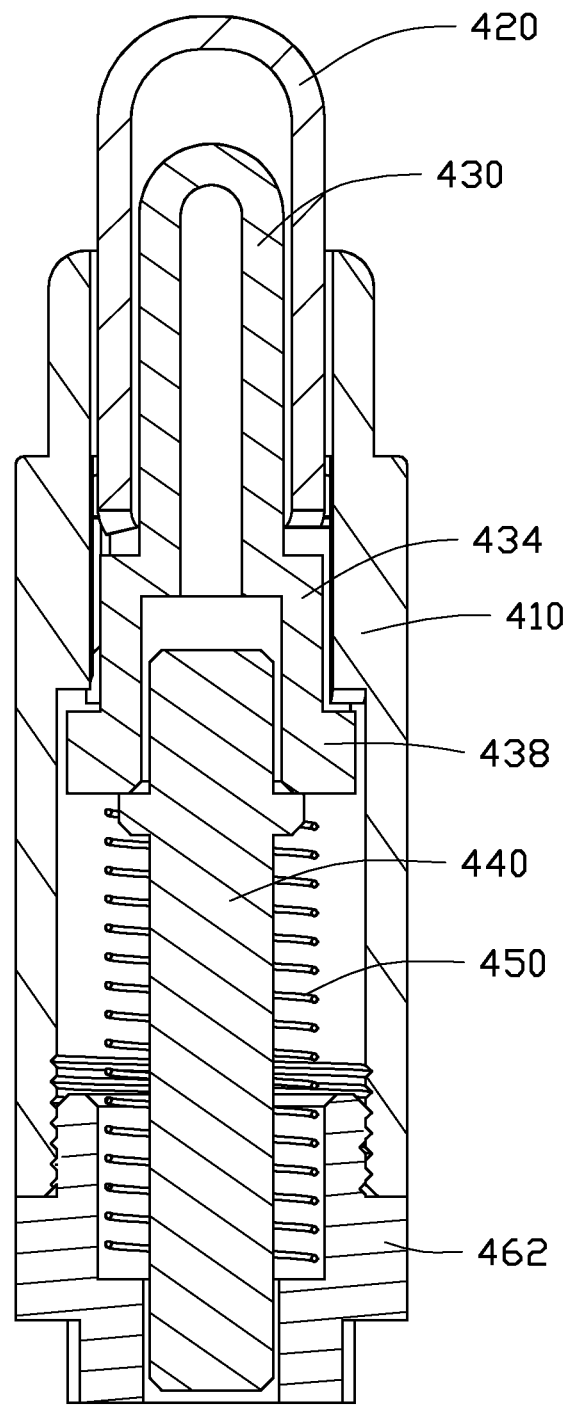
FIG. 7 is a cross-sectional view of the latching member taken along line VII-VII of FIG. 5.
Figure 8:
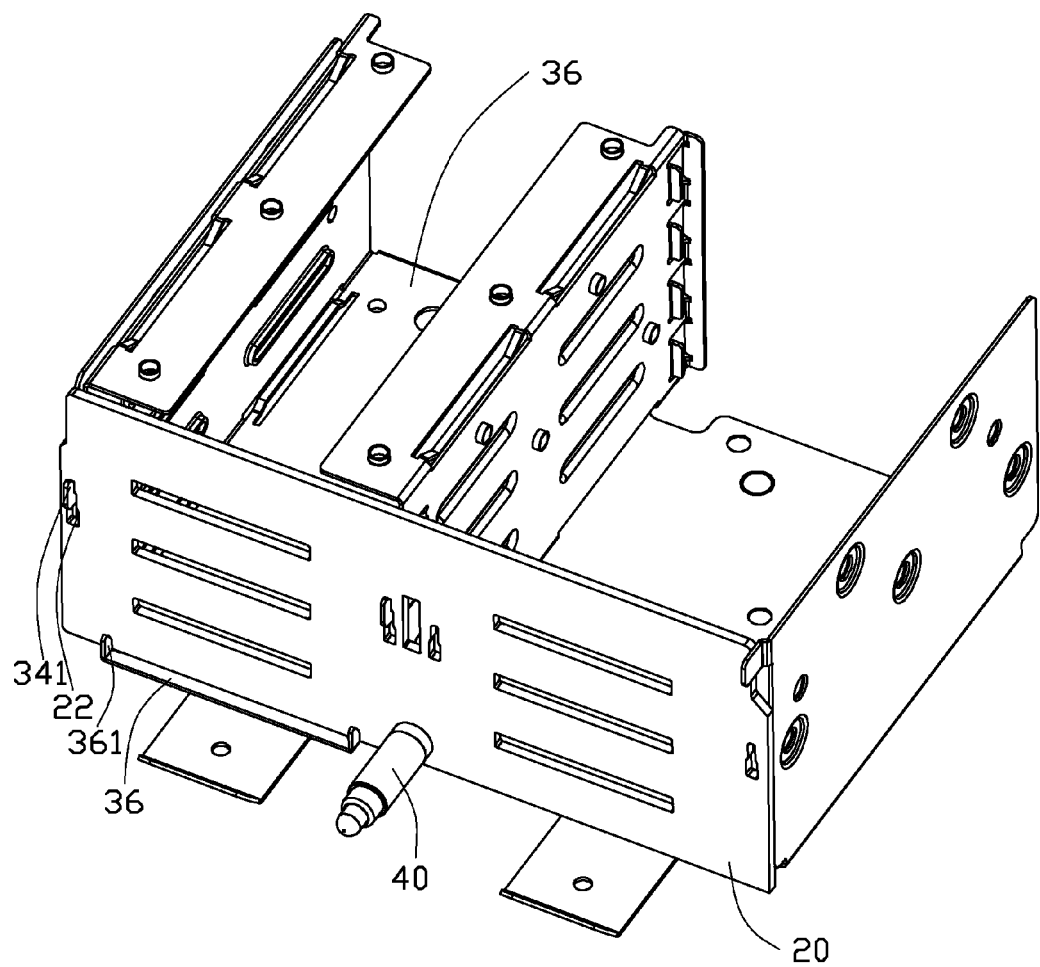
FIG. 8 is an assembled view of the circuit board assembly of FIG. 1.

FIGS. 2 to 4 show that the latching member 40 includes a cylindrical casing 410, a pressing member 420, a rotatable member 430, a retractable post 440, a spring 450, and a mounting member 460.

The cylindrical casing 410 includes a wide cylinder 416 and a narrow cylinder 418 connected to a top portion of the wide cylinder 416. A diameter of the wide cylinder 416 is greater than a diameter of the narrow cylinder 418. The wide cylinder 416 and the narrow cylinder 418 are substantially hollow and substantially coaxial. A height of the wide cylinder 416 is greater than a height of the narrow cylinder 418. The wide cylinder 416 includes a plurality of first sliding slots 412, a plurality of first protruding blocks 413, a plurality of second sliding slots 414, and a plurality of second protruding blocks 415. The plurality of first sliding slots 412 and the plurality of second sliding slots 414 are alternately defined around an inner circumference of the wide cylinder 416, and the plurality of first protruding blocks 413 and the plurality of second protruding blocks 415 are alternately formed around the inner circumference of the wide cylinder 416 (see FIG. 3). Screw threads 411 are formed around an inner circumference of the wide cylinder 416 and adjacent to a bottom end of the cylindrical casing 410. Each of the first protruding blocks 413 and the second protruding blocks 413 includes a slanted base surface facing a bottom opening of the cylindrical casing 410. A height of the first protruding block 413 is greater than a height of the second protruding block 415. Each first sliding slot 412 is defined between an adjacent first protruding block 413 and an adjacent second protruding block 413. Each second sliding slot 414 is defined in a corresponding second protruding block 415.

The pressing member 420 is substantially hollow. A top end of the pressing member 420 is closed, and a bottom end of the pressing member 420 is open. The pressing member 420 includes a main body 422. An outer diameter of the main body 422 is equal to or less than an inner diameter of the narrow cylinder 418. A plurality of sliding blocks 424 protrudes around a circumference of a lower portion of an outer surface of the main body 422. The plurality of sliding blocks 424 is slidable along the plurality of first sliding slots 412 and the plurality of second sliding slots 414. The main body 422 forms a plurality of substantially V-shaped wedges 426 around a bottom circumference of the main body 422. In one embodiment, a total number of the plurality of first sliding slots 412, a total number of the plurality of second sliding slots 414, a total number of the plurality of first protruding blocks 413, and a total number of the plurality of second protruding blocks 415 are the same. A total number of the plurality of sliding blocks 424 is equal to the total number of the plurality of first sliding slots 412 plus the total number of the plurality of second sliding slots 414.

The rotatable member 430 includes a shaft 432, a mounting post 434 connected to a lower portion of the shaft 432, and a base 438 connected to a lower portion of the mounting post 434. A diameter of the mounting post 434 is greater than a diameter of the shaft 432, but less than a diameter of the base 438. The shaft 432, the mounting post 434, and the base 438 are substantially hollow and substantially coaxial. The diameter of the shaft 432 is slightly less than an inner diameter of the pressing member 420. The diameter of the mounting post 434 is substantially equal to an outer diameter of the pressing member 420. A plurality of resisting blocks 436 protrudes around an outer circumference of the mounting post 434, and the resisting blocks 436 are spaced apart substantially the same distance. Each resisting block 436 forms a slanted surface 4361 at a top thereof. A height of each resisting block 436 is greater than a height of the mounting post 434.

The retractable post 440 includes a main post 442 and a blocking portion 444 protruding around an outer circumference of the main post 442. The blocking portion 444 is located adjacent to an upper end of the main post 442.

The mounting member 460 includes a connecting portion 462, a first mounting portion 464 connected to a bottom of the connecting portion 462, and a second mounting portion 466 connected to a top of the connecting portion 462. The second mounting portion 466 includes screw threads corresponding to the screw threads 411 of the cylindrical casing 410. Each of the connecting portion 462, the first mounting portion 464, and the second mounting portion 466 is substantially hollow and substantially cylindrical. Diameters of the first mounting portion 464 and the second mounting portion 466 are less than a diameter of the connecting portion 462.

Referring to FIGS. 5 through 8, in assembly, the disk drive bracket 30 is secured in the chassis 10 to abut one of the side plates 14. The pair of clamps 341 is received in a corresponding pair of mounting slots 22 of the circuit board 20. A bottom of the circuit board 20 is received in the pair of gaps 363 and abuts the protruding piece 36. The first mounting portion 464 of the latching member 40 is securely received in the mounting hole 24. The mounting hole 24 is aligned with the securing hole 161. The spring 450 is received in the mounting member 460, such that a bottom of the spring 450 abuts an inner surface of the connecting portion 462. The spring 450 sleeves the retractable post 440, such that the blocking portion 444 resists a top of the spring 450. An upper portion of the retractable post 440 is received through a bottom opening of the rotatable member 430, such that the blocking portion 444 abuts a bottom surface of the rotatable member 430. The shaft 432 is received in the pressing member 420 via a bottom opening of the pressing member 420, such that each slanting surface 4361 abuts a surface of a corresponding V-shaped wedge 426. The second mounting portion 466 is screwed into the cylindrical casing 410 via engagement between the screw threads 411 of the cylindrical casing 410 and the screw threads of the mounting member 460. An outer diameter of the wide cylinder 416 is substantially equal to the diameter of the connecting portion 462. The pressing member 420, the rotatable member 430, the retractable post 440, and the spring 450 are accommodated in the cylindrical casing 410. The plurality of sliding blocks 424 are slidably received in the plurality of first sliding slots 412 and the plurality of second sliding slots 414.

When the latching member 40 is in an unlocked position (see FIGS. 5 and 7), a top portion of the pressing member 420 protrudes out from a top of the cylindrical casing 410. The plurality of resisting blocks 436 is slidably received in the plurality of first sliding slots 412. The retractable post 440 does not protrude out from the mounting member 460.

To set the latching member 40 in a locked position, the pressing member 420 is pressed down, so that a lower end of the retractable member 440 protrudes out from the mounting member 460. When the pressing member 420 is pushed, the plurality of V-shaped wedges 426 presses the slanting surface 4361, and the spring 450 is compressed. The rotatable member 430 is simultaneously pushed outward and rotated by the pressing member 420 being pressed as a result of the slanting surfaces 4361 sliding across the first protruding blocks 413. When the pressing member 420 is released, the spring 450 elastically restores to push the rotatable member 430 inward. The rotatable member 430 is rotated along the base slanting surfaces of the second blocking pieces 415 by the spring force. The slanting surfaces 4361 resist against the second blocking pieces 415. The lower portion of the retractable post 440 protrudes out from the mounting member 460 and extends through the securing hole 161 for securing the circuit board 20.

To detach the circuit board 20, the pressing member 420 is pressed down. The rotatable member 430 is moved outward and is rotated away from the base slanting surface of the second protruding blocks 415, and the spring 450 is compressed. When the pressing member 420 is released, the spring 450 elastically restores to push the rotatable member 430 inward. The rotatable member 430 rotates while moving inward. The slanting surfaces 4361 rotate away from the second protruding blocks 415. The resisting blocks 436 are rotated to be received in the first sliding slots 412. Thus, the latching member 40 returns to the unlocked position, the retractable post 440 is disengaged from the securing hole 161, and the circuit board 20 is detachable from the disk drive bracket 30.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A circuit board mounting assembly comprising:
   a chassis with a securing hole;
   a circuit board attached to the chassis;
   a drive bracket, mounted in the chassis, and comprising at least one clamp engaged with the circuit board for preventing the circuit board moving along a first direction; and
   a latching member, configured to latch the circuit board, and comprising a retractable post; the retractable post is movable between a latched position and an unlatched position along the first direction;
   wherein when the retractable post is in the latched position, the retractable post is extended into the securing hole for preventing the circuit board moving along a second direction that perpendicular to the first direction, thereby locking the circuit board to the chassis; when the retractable post is in the unlatched position, the retractable post is retracted from the securing hole for unlocking the circuit board.

2. The circuit board mounting assembly of claim 1, wherein the latching member further comprises a cylindrical casing, a rotatable post, and a spring; an upper portion of the retractable post extends in the rotatable member and abuts a bottom of the rotatable member, and a lower portion of the retractable post extends in the spring; and the rotatable member, the retractable post, and the spring are installed in the cylindrical casing.

3. The circuit board mounting assembly of claim 2, wherein the cylindrical casing comprises a plurality of first sliding slots, a plurality of first protruding blocks, a plurality of second sliding slots, and a plurality of second protruding blocks alternately defined at an inner side of the cylindrical casing; and the rotatable member comprises a plurality of resisting blocks that is slidable along the plurality of first sliding slots or the plurality of second sliding slots.

4. The circuit board mounting assembly of claim 3, wherein when the plurality of resisting blocks is slidably received in the plurality of first sliding slots or in the plurality of second sliding slots, the retractable post is in the unlatched position; and when the plurality of resisting blocks is resisted against the plurality of first protruding blocks or resisted against the plurality of second protruding blocks, the retractable post is in the latched position.

5. The circuit board mounting assembly of claim 4, wherein a total number of the plurality of first sliding slots, a total number of the plurality of second sliding slots, a total number of the plurality of first protruding blocks, a total number of the plurality of second protruding blocks, and a total number of the plurality of resisting blocks are the same.

6. The circuit board mounting assembly of claim 5, wherein the latching member further comprises a pressing member movably mounted in the cylindrical casing, the rotatable member extends in the pressing member and is movable together with the pressing member; the pressing member comprises a main body and a plurality of sliding blocks protruding from a lower portion of an outer surface of the main body; the plurality of sliding blocks is slidable along the plurality of first sliding slots and the plurality of second sliding slots.

7. The circuit board mounting assembly of claim 6, wherein a total number of the plurality of sliding blocks is equal to the total number of the plurality of first sliding slots and the plurality of second sliding slots.

8. The circuit board mounting assembly of claim 6, wherein the main body comprises a plurality of V-shaped wedges at a bottom of the main body, and each of the plurality of resisting blocks comprises a slanting surface resisted against one of the plurality of V-shaped wedges.

9. The circuit board mounting assembly of claim 2, wherein the latching member further comprises a mounting member, the mounting member comprises a first mounting portion attached to the circuit board, a second mounting portion, and a connecting portion connected between the first mounting portion and the second mounting portion, one end of the spring is resisted against the retractable member, and another end of the spring is resisted against the second mounting portion.

10. The circuit board mounting assembly of claim 1, wherein the first direction is substantially perpendicular to the circuit board, and the second direction is substantially parallel to the circuit board.

11. A circuit board mounting assembly comprising:
a chassis with a securing hole;
a circuit board attached to the chassis;
a drive bracket mounted in the chassis and comprising at least one pair of tabs engaged with the circuit board for preventing the circuit board moving along a first direction; and
a latching member configured to latch the circuit board and comprising a retractable post, wherein the retractable post is movable between a latched position and an unlatched position along the first direction; when the retractable post is in the latched position, the retractable post is extended into the securing hole for preventing the circuit board moving along a second direction that perpendicular to the first direction, thereby locking the circuit board to the chassis; when the retractable post is in the unlatched position, the retractable post is retracted from the securing hole for unlocking the circuit board.

12. The circuit board mounting assembly of claim 11, wherein the latching member further comprises a cylindrical casing, a rotatable post, and a spring; an upper portion of the retractable post extends in the rotatable member and abuts a bottom of the rotatable member, and a lower portion of the retractable post extends in the spring; and the rotatable member, the retractable post, and the spring are installed in the cylindrical casing.

13. The circuit board mounting assembly of claim 12, wherein the cylindrical casing comprises a plurality of first sliding slots, a plurality of first protruding blocks, a plurality of second sliding slots, and a plurality of second protruding blocks alternately defined at an inner side of the cylindrical casing; and the rotatable member comprises a plurality of resisting blocks that is slidable along the plurality of first sliding slots or the plurality of second sliding slots.

14. The circuit board mounting assembly of claim 13, wherein when the plurality of resisting blocks is slidably received in the plurality of first sliding slots or in the plurality of second sliding slots, the retractable post is in the unlatched position; and when the plurality of resisting blocks is resisted against the plurality of first protruding blocks or resisted against the plurality of second protruding blocks, the retractable post is in the latched position.

15. The circuit board mounting assembly of claim 14, wherein a total number of the plurality of first sliding slots, a total number of the plurality of second sliding slots, a total number of the plurality of first protruding blocks, a total number of the plurality of second protruding blocks, and a total number of the plurality of resisting blocks are the same.

16. The circuit board mounting assembly of claim 15, wherein the latching member further comprises a pressing member movably mounted in the cylindrical casing, the rotatable member extends in the pressing member and is movable together with the pressing member; the pressing member comprises a main body and a plurality of sliding blocks protruding from a lower portion of an outer surface of the main body; the plurality of sliding blocks is slidable along the plurality of first sliding slots and the plurality of second sliding slots.

17. The circuit board mounting assembly of claim 16, wherein a total number of the plurality of sliding blocks is equal to the total number of the plurality of first sliding slots and the plurality of second sliding slots.

18. The circuit board mounting assembly of claim 16, wherein the main body comprises a plurality of V-shaped wedges at a bottom of the main body, and each of the plurality of resisting blocks comprises a slanting surface resisted against one of the plurality of V-shaped wedges.

19. The circuit board mounting assembly of claim 12, wherein the latching member further comprises a mounting member, the mounting member comprises a first mounting portion attached to the circuit board, a second mounting portion, and a connecting portion connected between the first mounting portion and the second mounting portion, one end of the spring is resisted against the retractable member, and another end of the spring is resisted against the second mounting portion.

20. The circuit board mounting assembly of claim 11, wherein the first direction is substantially perpendicular to the circuit board, and the second direction is substantially parallel to the circuit board.

\* \* \* \* \*